(12) United States Patent
Ishikawa et al.

(10) Patent No.: US 8,262,844 B2
(45) Date of Patent: Sep. 11, 2012

(54) PLASMA PROCESSING APPARATUS, PLASMA PROCESSING METHOD AND STORAGE MEDIUM

(75) Inventors: Hiraku Ishikawa, Miyagi (JP); Yasuhiro Tobe, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 420 days.

(21) Appl. No.: 12/529,424

(22) PCT Filed: Feb. 26, 2008

(86) PCT No.: PCT/JP2008/053237
§ 371 (c)(1),
(2), (4) Date: Sep. 1, 2009

(87) PCT Pub. No.: WO2008/108213
PCT Pub. Date: Sep. 12, 2008

(65) Prior Publication Data
US 2010/0089871 A1   Apr. 15, 2010

(30) Foreign Application Priority Data
Mar. 8, 2007  (JP) ................................. 2007-058537

(51) Int. Cl.
*C23F 1/00* (2006.01)
*H01L 21/306* (2006.01)

(52) U.S. Cl. .......... 156/345.1; 156/345.33; 156/345.41; 156/345.42

(58) Field of Classification Search ................ None
See application file for complete search history.

(56) References Cited

U.S. PATENT DOCUMENTS
6,792,889 B2 * 9/2004 Nakano et al. ............ 118/723 E
2002/0111000 A1 * 8/2002 Kawakami et al. ........... 438/584
2003/0141821 A1 * 7/2003 Nakano et al. ............ 315/111.21

FOREIGN PATENT DOCUMENTS
| JP | 06-104184 A | 4/1994 |
| JP | 06-188222 A | 7/1994 |
| JP | 09-172000 A | 6/1997 |
| JP | 2000-294550 A | 10/2000 |
| JP | 2003-203904 A | 7/2003 |

(Continued)

OTHER PUBLICATIONS

International Search Report for PCT/JP2008/053237, dated Mar. 25, 2008.
Chinese Office action for 200880006784.1 dated Jun. 24, 2010.
Taiwanese Office action for 097106879 dated Sep. 5, 2011.

(Continued)

*Primary Examiner* — Duy Deo
(74) *Attorney, Agent, or Firm* — Pearne & Gordon LLP (57) ABSTRACT

Provided is a plasma processing apparatus including a processing vessel accommodating a target object; a microwave generator configured to generate a microwave; a waveguide configured to induce the microwave to the processing vessel; a planar antenna having a plurality of microwave radiation holes through which the microwave induced to the waveguide is radiated toward the processing vessel; a microwave transmission plate configured to serve as a ceiling wall of the processing vessel and transmit the microwave passed from the microwave radiation holes of the planar antenna; a processing gas inlet unit configured to introduce a processing gas into the processing vessel; and a magnetic field generating unit positioned above the planar antenna and configured to generate a magnetic field within the processing vessel and control a property of plasma of the processing gas by the magnetic field, the plasma being generated by the microwave within the processing vessel.

14 Claims, 9 Drawing Sheets

FOREIGN PATENT DOCUMENTS

| | | |
|---|---|---|
| JP | 2006-237640 A | 9/2006 |
| KR | 10-2001-0050312 A | 6/2001 |
| KR | 10-2004-0070103 A | 8/2004 |
| WO | 2006/073152 A1 | 7/2006 |

OTHER PUBLICATIONS

Korean Office action for 10-2009-7020482 dated Jan. 7, 2011.
Japanese Office action for 2009-502520 dated Feb. 8, 2011.

* cited by examiner

PLASMA PROCESSING APPARATUS, PLASMA PROCESSING METHOD AND STORAGE MEDIUM

TECHNICAL FIELD

The present invention relates to a plasma processing apparatus and a plasma processing method configured to perform a microwave plasma process on a target object such as a semiconductor wafer, and a computer-readable storage medium configured to store a computer program performing such a method.

BACKGROUND ART

A plasma process is essential in manufacturing a semiconductor device. In response to a demand for a high-integration and high-speed of LSI (Large Scale Integrated Circuit), a design rule is miniaturized while a semiconductor wafer becomes scaled up. Accordingly, a plasma processing apparatus is required to keep up with such miniaturization and scale-up.

However, in a parallel plate type plasma processing apparatus or inductively coupled plasma processing apparatus conventionally often used, an electron temperature is high, so that plasma damage may be inflicted on a microstructure. Further, since a high-density plasma region is limited, it is difficult to uniformly perform a plasma process on a scaled-up semiconductor wafer at a high speed.

Accordingly, a microwave plasma processing apparatus using a radial line slot antenna (RLSA) has attracted more attention since it is capable of uniformly generating plasma with a high density and a low electron temperature (see, for example, Patent Document 1).

Patent Document 1: Japanese Patent Laid-open Publication No. 2000-294550

DISCLOSURE OF THE INVENTION

Problems to be Solved by the Invention

In a RLSA microwave plasma processing apparatus, a planar antenna (radial line slot antenna) having a plurality of slots formed in a certain pattern is provided in an upper portion of a chamber, and a microwave induced from a microwave generator passes through a dielectric microwave transmission plate provided under the planar antenna via the slots of the planar antenna and the microwave is radiated into the chamber maintained in vacuum. A gas introduced into the chamber is excited into plasma by a microwave electric field generated in that way, and a target object such as a semiconductor wafer is processed by the plasma.

In the RLSA microwave plasma processing apparatus, the plasma is generated by the microwave transmitted from the microwave transmission plate as described above. In this case, if an electron density in the plasma is higher than a cut-off density of the microwave, the microwave can not enter the plasma and thus surface wave plasma (SWP) propagated between the plasma and the microwave transmission plate in a plane direction only is generated. The surface wave plasma has a high density and a low electron temperature and can achieve a high plasma density in a large region underneath the antenna, so that a plasma process can be performed in a uniform manner and in a short time. Further, since an electrode is not needed to be installed in the chamber, plasma damage to the electrode or metal contamination caused by the electrode damage decreases, so that damage to parts or components can be reduced.

However, in a surface wave plasma processing apparatus such as a CVD apparatus using surface wave plasma, it is still demanded to improve a plasma density or uniformity and to further suppress damage to components.

In view of the foregoing, there are provided a plasma processing apparatus and a plasma processing method capable of improving a plasma density or uniformity and suppressing damage to components. Further, there is provided a storage medium configured to store a program performing the plasma processing method in the plasma processing apparatus.

Means for Solving the Problems

In accordance with a first aspect of the present invention for solving the problems, there is provided a plasma processing apparatus including: a processing vessel accommodating a target object; a microwave generator configured to generate a microwave; a waveguide configured to induce the microwave generated by the microwave generator to the processing vessel; a planar antenna made of a conductive material and having a plurality of microwave radiation holes through which the microwave induced to the waveguide is radiated toward the processing vessel; a microwave transmission plate made of a dielectric material and configured to serve as a ceiling wall of the processing vessel and transmit the microwave passed from the microwave radiation holes of the planar antenna; a processing gas inlet unit configured to introduce a processing gas into the processing vessel; and a magnetic field generating unit positioned above the planar antenna and configured to generate a magnetic field within the processing vessel and control a property of plasma of the processing gas by the magnetic field, the plasma being generated by the microwave within the processing vessel.

In the plasma processing apparatus in accordance with the first aspect, the magnetic field generating unit may include a ring-shaped magnet arranged concentrically with the planar antenna. In addition, it is desirable that the plasma processing apparatus further includes a first moving unit configured to move the magnetic field generating unit in a direction of being closer to or away from the processing vessel. Moreover, it is desirable that the plasma processing apparatus further includes a second moving unit, additionally to or independently of the first moving unit, configured to move the magnetic field generating unit in an intersecting direction to a direction of being closer to or away from the processing vessel. Here, it is desirable that the second moving unit moves the magnetic field generating unit such that a center of the magnetic field generating unit revolves around a center of the planar antenna.

Further, in the plasma processing apparatus in accordance with the first aspect, the magnetic field generating unit may include at least two ring-shaped magnets arranged concentrically with the planar antenna. In addition, it is desirable that the plasma processing apparatus further includes a third moving unit configured to move at least one of the ring-shaped magnets in a direction of being closer to or away from the processing vessel. Moreover, it is desirable that the plasma processing apparatus further includes, additionally to or independently of the third moving unit, a fourth moving unit configured to move at least one of the ring-shaped magnets in an intersecting direction to a direction of being closer to or away from the processing vessel. Here, it is desirable that the fourth moving unit moves at least one of the ring-shaped magnets such that a center of at least one of the ring-shaped magnets revolves around a center of the planar antenna.

Further, it is desirable that the plasma processing apparatus further includes a controller configured to control movement of the ring-shaped magnets such that the property of plasma within the processing vessel is controlled by the ring-shaped magnetic field generating unit.

In accordance with a second aspect of the present invention, there is provided a plasma processing method including: loading a target object into a processing vessel; supplying a processing gas into the processing vessel; guiding a microwave generated by a microwave generator to a planar antenna made of a conductive material and having a plurality of microwave radiation holes through a waveguide; introducing the microwave from the planar antenna into the processing vessel; generating plasma of the processing gas within the processing vessel; and controlling a property of the plasma of the processing gas by applying a magnetic field thereto. The process of controlling the plasma may include controlling the magnetic field so as to achieve a desired plasma property. In addition, it is desirable that the process of controlling the plasma includes independently moving at least one of at least two ring-shaped magnets arranged concentrically with the planar antenna in a direction of being closer to or away from the processing vessel, and that the process of controlling the plasma includes independently moving at least one of at least two ring-shaped magnets arranged concentrically with the planar antenna in an intersecting direction to a direction of being closer to or away from the processing vessel. Moreover, it is desirable that the process of controlling the plasma includes independently moving at least one of at least two ring-shaped magnets arranged concentrically with the planar antenna such that a center of at least one of the ring-shaped magnets revolves around a center of the planar antenna.

In accordance with a third aspect of the present invention, there is provided a computer-readable storage medium configured to store a program performing the above-mentioned plasma processing method in the above-stated plasma processing apparatus.

Effect of the Invention

In accordance with embodiments of the present invention, there are provided a plasma processing apparatus and a plasma processing method capable of improving a plasma density or uniformity and suppressing damage to components, and a storage medium configured to store a program performing the plasma processing method in the plasma processing apparatus.

EXPLANATION OF CODES

1: Chamber
2: Housing
3: Chamber wall
4: Supporting member
5: Susceptor
13: Ring-shaped passage
14: Gas passage
15*a*: Gas inlet opening
15*b*: Gas inlet passage
16: Gas supply unit
18, 19: Step portions
24: Evacuation unit
27: Upper plate (Supporting member)
27*a*: Supporting unit
28: Transmission plate
29: Sealing member
30: Microwave introduction unit
31: Planar antenna
32: Slot hole
37: Waveguide
37*a*: Coaxial waveguide
37*b*: Rectangular waveguide
39: Microwave generator
40: Mode converter
51, 52: Ring-shaped magnet
60: Magnet moving unit
100: Plasma processing apparatus
W: Semiconductor wafer (Target object)

BEST MODE FOR CARRYING OUT THE INVENTION

In accordance with an embodiment of the present invention, a magnetic field generating unit configured to apply a magnetic field to plasma generated within a processing chamber is provided at an upper portion of a processing vessel and the plasma is controlled by the magnetic field, so that it is possible to make a plasma density higher and further improve a plasma uniformity.

If the magnetic field generating unit has a ring-shaped magnet arranged concentrically with a planar antenna, a plasma ring can be formed by concentrating the plasma between an N-pole and an S-pole of the ring-shaped magnet. Accordingly, a plasma density in a low-density plasma region such as a peripheral portion of the processing vessel can be increased. In particular, if the magnetic field generating unit has two or more ring-shaped magnets, by concentrating the plasma between each N-pole and each S-pole of the ring-shaped magnets, a plurality of plasma rings can be formed into a concentric circular shape and a plasma density can be uniformized in a larger region. Therefore, a plasma process can be more uniformly performed.

Further, in a plasma processing apparatus in accordance with the present invention, the magnetic field generating unit can be positioned relatively close to the plasma, so that influence or effect of the magnetic field on the plasma can be increased. Furthermore, since the magnetic field generating unit can be positioned relatively close to the plasma, a strong magnetic field can be applied to the plasma, while a weak magnetic field can be applied to a semiconductor wafer. Therefore, it is possible to further suppress charge-up damage or the like to the semiconductor wafer. Moreover, since the magnetic field generating unit can be positioned relatively closer to the plasma and thus influence or effect of the magnetic field on the plasma can be increased, the magnetic field generating unit can be miniaturized and readily used when a diameter of a processing vessel in increased.

Further, a magnet moving unit configured to move the magnetic field generating unit to be close to or away from the processing vessel may be further provided, so that a distribution of the magnetic fields within the processing vessel can be controlled. Therefore, plasma properties such as a plasma density or a plasma uniformity can be controlled. If at least two ring-shaped magnets are arranged in a concentric circular shape, a magnet moving unit configured to respectively move at least one of the ring-shaped magnets to be close to or away from the processing vessel can be provided, whereby a magnetic field intensity can be varied depending on a position in a plasma excitation space, e.g., a central position or a peripheral position in the plasma excitation space and the plasma properties such as the plasma density can be controlled. Accordingly, a process property and a uniformity of a plasma process can be optimized.

Hereinafter, a plasma processing apparatus in accordance with embodiments of the present invention will be described in detail with reference to the accompanying drawings. In drawings, parts identical or corresponding to each other are assigned identical or corresponding reference numerals and redundant explanation will be omitted. Further, the drawings are provided without a comparative ratio between the parts illustrated therein. Therefore, specific sizes thereof should be determined by those skilled in the art in view of non-limited embodiments to be described below.

Figure 1:
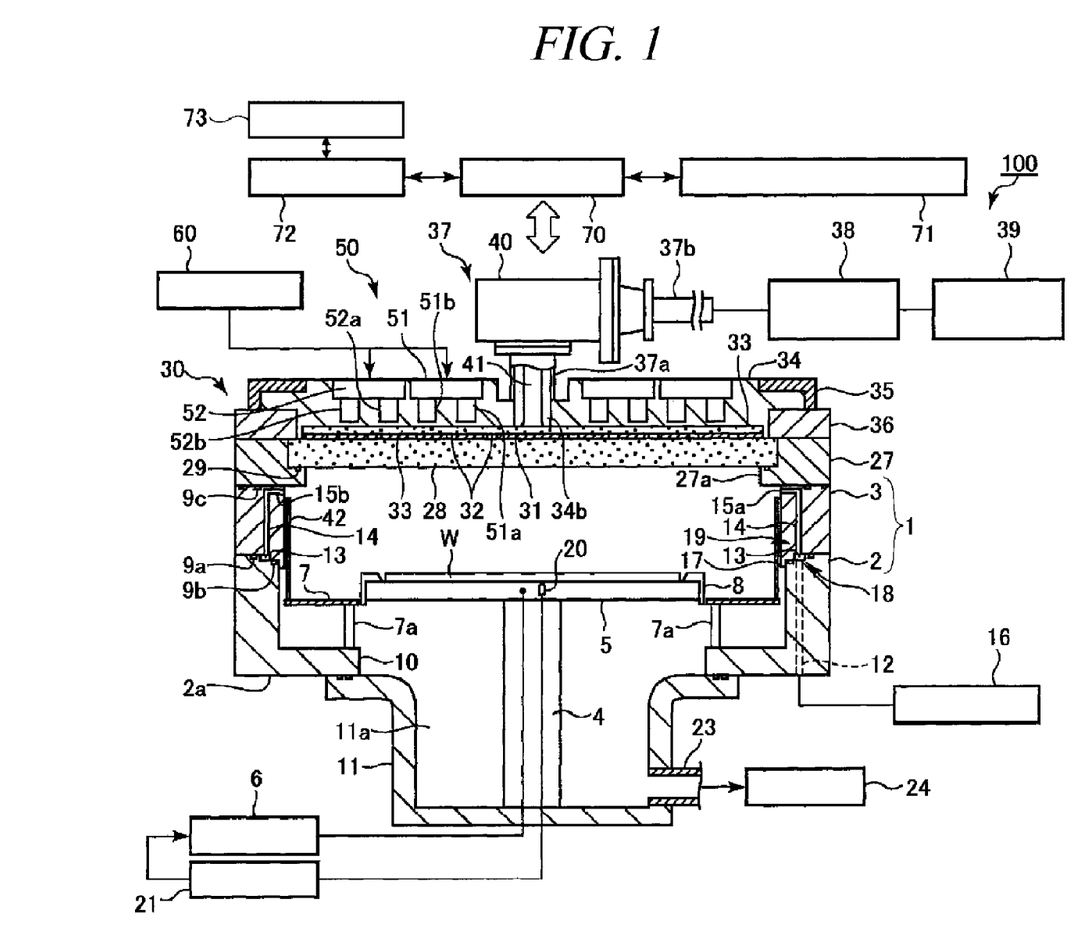
FIG. 1 is a schematic cross-sectional view of a plasma processing apparatus in accordance with an embodiment of the present invention.

FIG. 1 is a schematic cross-sectional view of a plasma processing apparatus in accordance with an embodiment of the present invention. In the plasma processing apparatus 100, a microwave is introduced into a processing chamber through a planar antenna having a plurality of slots such as a radial line slot antenna (RLSA) so that microwave plasma having a high density and a low electron temperature is generated within the processing chamber.

In the plasma processing apparatus 100, the plasma excited by the microwave is surface wave plasma (SWP) excited by a surface wave propagated along an interface between the plasma and a dielectric member positioned underneath the antenna and the surface wave plasma has a high density and a low electron temperature. Since the surface wave plasma has a high plasma density in a large region underneath the antenna, a plasma process can be uniformly performed in a short time. Further, an electrode is not needed to be provided in the chamber, so that metal contamination, plasma damage or the like decreases and thus damage to components can be reduced.

The plasma processing apparatus 100 is airtightly provided. Further, the plasma processing apparatus 100 includes a substantially cylindrical chamber (processing vessel) 1 which a wafer W is loaded into and is grounded. With reference to FIG. 1, the chamber 1 includes a housing 2 and a cylindrical chamber wall 3 on the housing 2. The housing 2 and the chamber wall 3 are made of metal such as aluminum or stainless steel. Furthermore, an openable/closable microwave introduction unit 30 configured to introduce a microwave into a processing space is provided at an upper portion of the chamber 1.

At a lower portion of the housing 2, an evacuation chamber 11 is provided so as to be connected with an opening 10 formed at a substantially central portion of a bottom plate 2a of the housing 2, whereby the inside of the chamber 1 is uniformly evacuated.

In the housing 2, a susceptor 5 configured to horizontally support a wafer W serving as a target object of a plasma process is provided. To be specific, the susceptor 5 is supported by a cylindrical supporting member 4 upwardly extended from a center of a bottom portion of the evacuation chamber 11. The susceptor 5 and the supporting member 4 may be made of quartz or a ceramic material such as AlN or $Al_2O_3$. In particular, it is desirable to make the susceptor 5 and the supporting member 4 by using AlN having a good thermal conductivity. In an outer periphery portion of the susceptor 5, a guide ring 8 configured to guide the wafer W is provided. Further, a resistance heater (not illustrated) is embedded in the susceptor 5 and the heater heats the susceptor 5 and further the wafer W supported by the susceptor 5 by receiving power from a heater power supply 6. A temperature of the susceptor 5 is measured by a thermocouple 20 inserted into the susceptor 5, and an electric current supplied from the heater power supply 6 to the heater is controlled by a temperature controller 21 based on a signal from the thermocouple 20, whereby the temperature of the susceptor 5 is adjusted at a temperature ranging from room temperature to about 1000° C., for example.

In the susceptor 5, wafer supporting pins (not illustrated) configured to support and elevate the wafer W are provided. The wafer supporting pins can be moved upward and downward with respect to the susceptor 5. Further, a baffle plate 7 serving to uniformly evacuate the inside of the chamber 1 is formed into a ring shape outside the susceptor 5. The baffle plate 7 is supported by a plurality of supporting columns 7a. Furthermore, a cylindrical liner 42 made of quartz is provided on an inner circumference of the chamber 1. The liner 42 prevents metal contamination caused by the chamber 1 made of metal, thereby maintaining clean environment. Alternatively, the liner 42 may be made of ceramic ($Al_2O_3$, AlN, $Y_2O_3$ or the like) instead of quartz.

A side surface of the evacuation chamber 11 is connected with an evacuation pipe 23. The evacuation pipe 23 is connected with an evacuation unit 24 including a high speed evacuation pump. By operating the evacuation unit 24, a gas inside of the chamber 1 is uniformly exhausted to an inside of a space 11a of the evacuation chamber 11 and evacuated through the evacuation pipe 23. In this way, a pressure inside the chamber 1 can be reduced to a certain vacuum level, e.g., about 0.133 Pa at a high speed.

In a side wall of the housing 2, a loading/unloading port configured to load and unload the wafer W is formed and a gate valve configured to open and close the loading/unloading port is provided (both not illustrated).

The chamber 1 has a gas inlet passage that introduces a processing gas into the chamber 1. To be specific, a ring-shaped passage 13 is formed by a step portion 18 formed at an upper end of the side wall of the housing 2 and a step portion 19 formed at a lower end of the chamber wall 3 to be described below.

An upper portion of the chamber wall 3 is engaged with the microwave introduction unit 30 via a sealing member 9c such as an O ring, and the lower portion of the chamber wall 3 is in contact with an upper portion of the housing 2 via a sealing members 9a and 9b such as O rings. Accordingly, it is possible to maintain an airtight state between the chamber wall 3 and the microwave introduction unit 30 and between the chamber wall 3 and the housing 2. Further, a gas passage 14 is formed inside of the chamber wall 3.

In the lower end portion of the chamber wall 3, a ring-shaped protrusion 17 is downwardly extended in a skirt shape. The protrusion 17 covers an interface (contact surface portion) between the chamber wall 3 and the housing 2 and thus prevents the sealing member 9b having a relatively low plasma resistance from being exposed directly to the plasma. Further, at the lower end of the chamber wall 3, the step portion 19 is formed such that the ring-shaped passage 13 is formed by the step portion 19 in combination with the step portion 18 of the housing 2.

In an upper portion of the chamber wall 3, a plurality of (e.g., 32) gas inlet openings 15a are uniformly provided along an inner circumference. The gas inlet openings 15a are communicated with the gas passage 14 vertically extended within the chamber wall 3 via a gas inlet passage 15b horizontally extended within the chamber wall 3.

The gas passage 14 is connected with the ring-shaped passage 13 formed into a groove between the step portions 18 and 19 at the contact surface portion between the upper portion of the housing 2 and the lower portion of the chamber wall 3. The ring-shaped passage 13 is formed into a ring shape in a substantially horizontal direction so as to surround the processing space. Further, the ring-shaped passage 13 is connected with a passage 12 vertically extended within the side wall of the housing unit 2 at certain points (e.g., four eqi-spaced points). The passage 12 is connected with a gas supply unit 16. The ring-shaped passage 13 functions as a gas distribution unit uniformly supplying a gas to each gas passage 14, whereby it is possible to prevent a large amount of the processing gas from being supplied to the processing space from a certain gas inlet opening 15a.

In the present embodiment as described above, the gas is uniformly introduced into the chamber 1 from the gas supply unit 16 through the passage 12, the ring-shaped passage 13, each gas passage 14 and 32 number of gas inlet openings 15a, so that plasma uniformity within the chamber 1 can be increased.

As described above, since the chamber 1 is comprised of the housing 2 and the cylindrical chamber wall 3 positioned on the housing 2, the chamber 1 has an upward opening. The opening is airtightly closed by the microwave introduction unit 30. However, the microwave introduction unit 30 can be opened or closed by a non-illustrated opening/closing unit.

The microwave introduction unit 30 includes a transmission plate 28, a planar antenna 31 positioned above the transmission plate 28 and a wavelength shortening member 33 positioned on the planar antenna 31, which are covered with a shield member 34. Further, the transmission plate 28, the planar antenna 31 and the wavelength shortening member 33 are fixed to an upper plate 27 serving as a supporting member by a ring-shaped pressing ring 35, formed into an L-shape when viewed in a cross-section, via a supporting member 36 and an O-ring. When the microwave introduction unit 30 is closed, the upper end of the chamber 1 and the upper plate 27 are sealed by the sealing member 9c. The planar antenna 31 and the wavelength shortening member 33 are supported by the upper plate 27 via the transmission plate 28.

Figure 10:
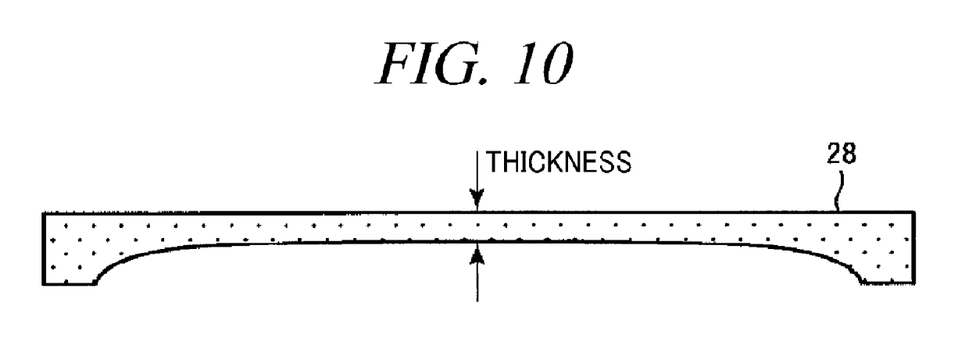
FIG. 10 is a cross-sectional view illustrating another example of a microwave transmission plate.

The transmission plate 28 is made of a dielectric material such as quartz or ceramics such as $Al_2O_3$, AlN, sapphire or SiN. The transmission plate 28 transmits a microwave and serves as an introduction window of the microwave introduced into the processing space of the chamber 1. A bottom surface (surface facing the susceptor 5) of the transmission plate 28 may have, but not limited to, a planar shape or may have, e.g., a recess or a groove in order to uniformize the microwave and stabilize the plasma. Alternatively, as illustrated in FIG. 10, the bottom surface of the transmission plate 28 may be formed into a dome shape. Since a pressure caused by a difference between an atmospheric pressure and an internal pressure of the processing vessel is applied to the transmission plate 28, it needs to have a thickness ranging from about 20 to about 30 mm in case of the planar transmission plate. However, in case of the dome-shaped transmission plate, its thickness can be reduced by about 10-20%.

The bottom surface of the transmission plate 28 is supported by a ring-shaped protrusion 27a inwardly and radially extended from the upper plate 27 via the sealing member 29 at its outer peripheral portion. Accordingly, when the microwave introduction unit 30 is closed, the inside of the chamber 1 can be maintained airtightly.

The planar antenna 31 has a circular plate shape. Further, the planar antenna 31 is fitted to an inner circumferential surface of the shield member 34 above the transmission plate 28. The planar antenna 31 is made of, e.g., a gold-plated or silver-plated copper plate or aluminum plate. Since the planar antenna 31 radiates an electromagnetic wave such as a microwave, a plurality of slot holes 32 formed through the planar antenna 31 are arranged in a predetermined pattern.

Figure 2:
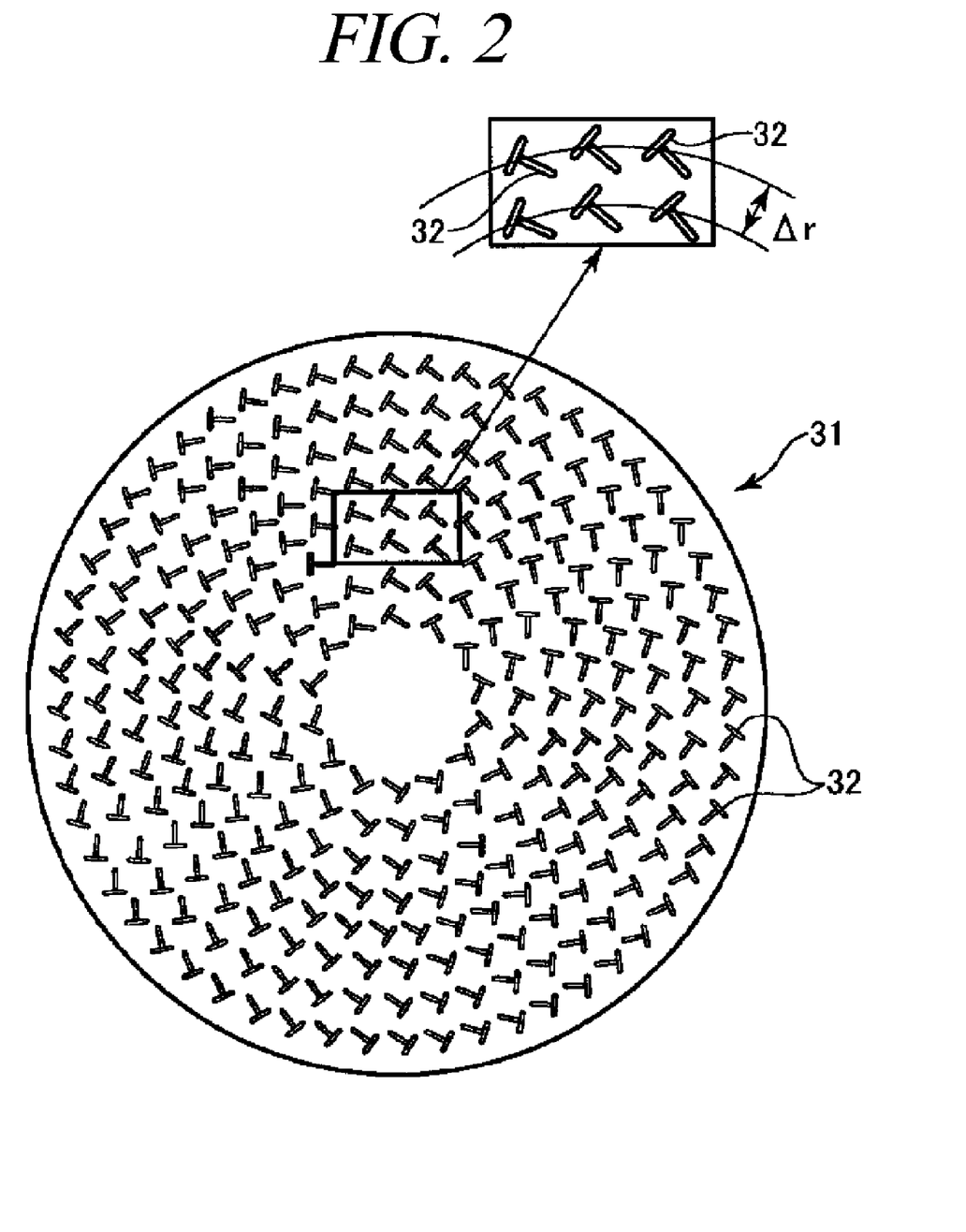
FIG. 2 is a schematic top view of a planar antenna used in the plasma processing apparatus of FIG. 1.

The slot hole 32 has a long groove shape when viewed from the top as illustrated in FIG. 2, for example. Typically, the adjacent two slot holes 32 are combined and formed into a T-shape. The plurality of slot holes 32 are arranged in a concentric circular shape as illustrated in FIG. 2. A length of the slot hole 32 or an arrangement gap is determined according to a wavelength $\lambda g$ of the microwave. For example, the slot holes 32 are arranged such that a gap therebetween is set to be one fourth ($\frac{1}{4}$), one half ($\frac{1}{2}$) or equal to the wavelength $\lambda g$ of the microwave. Here, $\lambda g$ is a wavelength of the microwave within the wavelength shortening member 33. Furthermore, a gap between two pairs of T-shaped slot holes 32 arranged in a concentric circular shape is shown as $\Delta r$ in FIG. 2. Moreover, the slot holes 32 may be arranged in a circular shape, a circular arc shape or the like. However, it is not limited thereto and may be arranged in a spiral shape or a radial shape, for example.

The wavelength shortening member 33 is positioned on a top surface of the planar antenna 31. The wavelength shortening member 33 has a dielectric constant higher than that of a vacuum and is made of quartz, ceramic, a fluorine-based resin such as polytetrafluoroethylene or a polyimide-based resin. A microwave wavelength in the wavelength shortening member 33 is shorter than that in a vacuum due to a high dielectric constant. That is, the wavelength shortening member 33 serves to control the plasma. Further, the transmission plate 28 and the planar antenna 31 may be closely adhered to each other or may be separated from each other. Further, the planar antenna 31 and the wavelength shortening member 33 may be closely contacted to each other or there may be a gap therebetween.

A cooling water path (not illustrated) is formed through the shield member 34, and the shield member 34, the wavelength shortening member 33, the planar antenna 31, the transmission plate 28 and the upper plate 27 can be cooled by flowing cooling water through the cooling water path, whereby it is possible to prevent these components from being deformed or damaged and thus generate stable plasma. In this case, the shield member 34 is grounded.

The shield member 34 has an opening 34b in its central portion. The opening 34b is connected with a waveguide 37. An end portion of the waveguide 37 is connected with a microwave generator 39 via a matching circuit 38. With this configuration, a microwave having a frequency, e.g., about 2.45 GHz generated by the microwave generator 39 is propagated into the planar antenna 31 through the waveguide 37. Alternatively, the frequency of the microwave may be 8.35 GHz, 1.98 GHz or the like.

The waveguide 37 includes a coaxial waveguide 37a upwardly extended from the opening 34b of the shield member 34 and having a cross-sectional circular shape and a rectangular waveguide 37b connected with an upper end portion of the coaxial waveguide 37a via a mode converter 40 and extended in a horizontal direction. The mode converter 40 between the rectangular waveguide 37b and the coaxial waveguide 37a converts a microwave transmitted in a TE mode within the rectangular waveguide 37b into a TEM mode. An inner conductor 41 is extended in the center of the coaxial waveguide 37a and a lower end portion of the inner conductor 41 is connected and fixed to the center of the planar antenna 31. With this configuration, the microwave is efficiently and uniformly propagated radially into the planar antenna 31.

Figure 3:
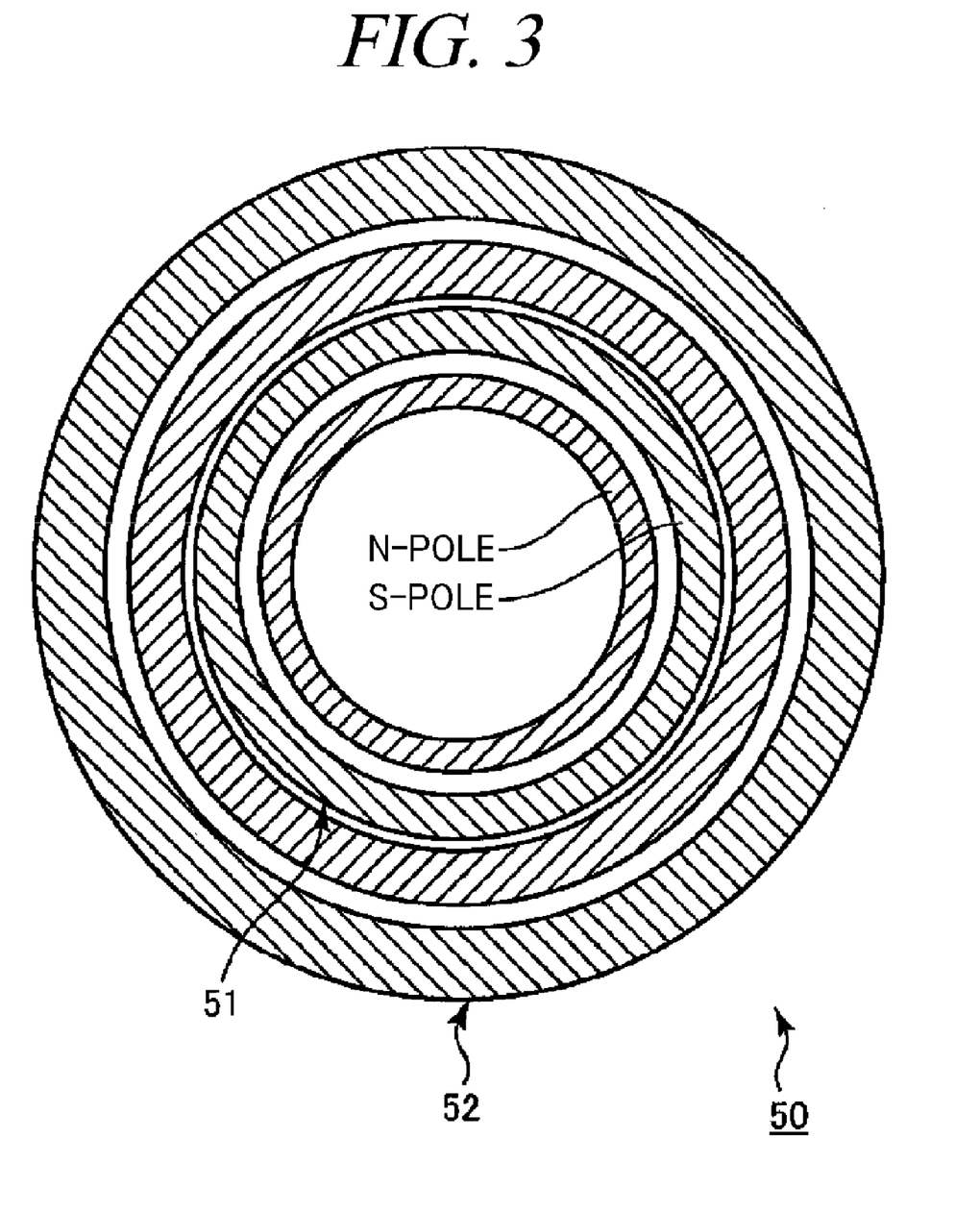
FIG. 3 is a schematic top view of a ring-shaped magnet of a magnet unit used in the plasma processing apparatus of FIG. 1.
Figure 4:
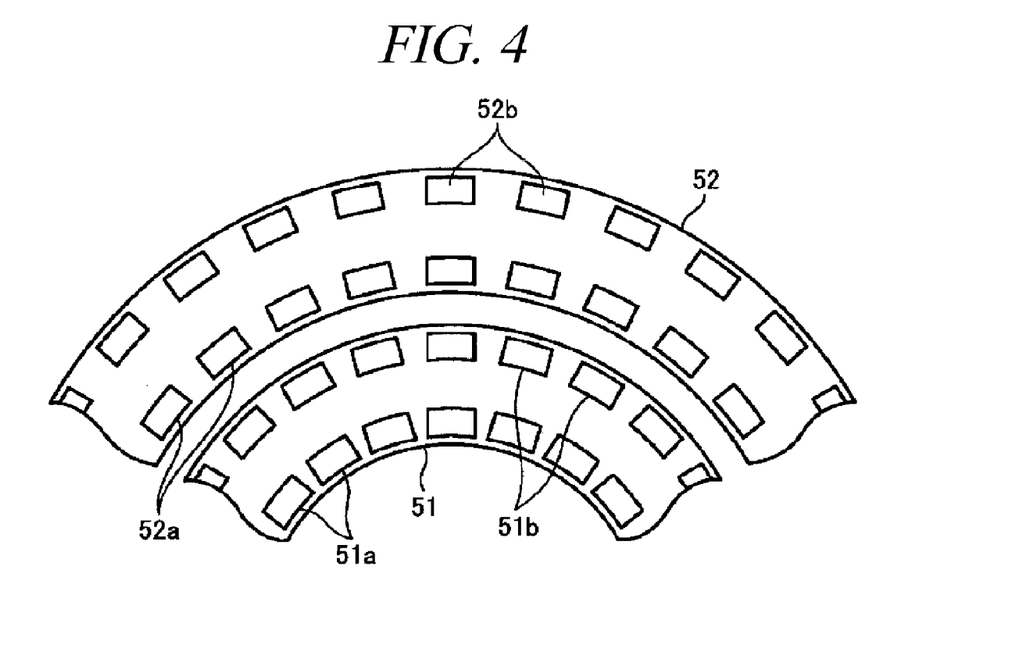
FIG. 4 is an enlarged plane view showing a portion of the ring-shaped magnet.

Above the planar antenna 31, a magnet unit 50 configured to generate a magnetic field within the chamber 1 is provided. The magnet unit 50 includes ring-shaped magnets 51 and 52 arranged to be concentric with each other and with the planar antenna 31 as illustrated in FIG. 3. As illustrated in FIG. 4, a plurality of N-polar segments 51a are attached to one surface of the ring-shaped magnet 51 along an inner circumference of the ring-shaped magnet 51 and a plurality of S-polar segments 51b are attached to the same surface of the ring-shaped magnet 51 along an outer circumference of the ring-shaped magnet 51. Further, a plurality of N-polar segments 52a are attached to one surface of the ring-shaped magnet 52 along an inner circumference of the ring-shaped magnet 52 and a plurality of S-polar segments 52b are attached to the same surface of the ring-shaped magnet 52 along an outer periphery of the ring-shaped magnet 52.

Figure 5:
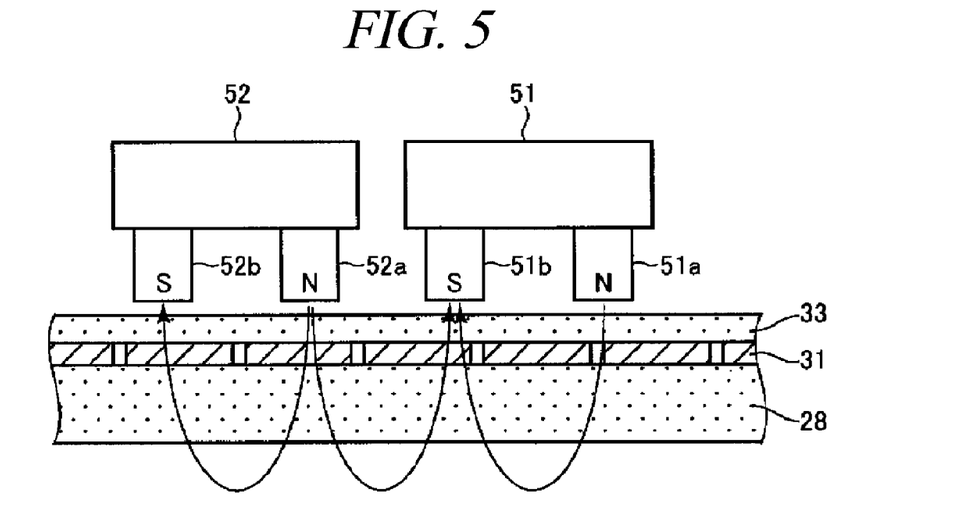
FIG. 5 is a schematic diagram illustrating magnetic force lines of the ring-shaped magnet of the magnet unit used in the plasma processing apparatus of FIG. 1.

As illustrated in FIG. 5, with the configuration of the magnet unit 50, strong magnetic fields are formed between the ring-shaped magnets 51 and 52, between the N-pole 51a and the S-pole 51b of the ring-shaped magnet 51 and between the N-pole 52a and the S-pole 52b of the ring-shaped magnet 52, respectively. When plasma is generated within the chamber 1, such a magnetic field generates a strong E×B drift and thus the plasma can be concentrated. As a result thereof, three plasma rings are formed in a concentric circular shape within the chamber 1.

The ring-shaped magnets 51 and 52 can be moved in a vertical direction by a magnet moving unit 60, and they can be independently moved in a direction of being close to or away from the chamber 1. Alternatively, the magnet moving unit 60 may move only one of the ring-shaped magnets 51 and 52.

Figure 6:
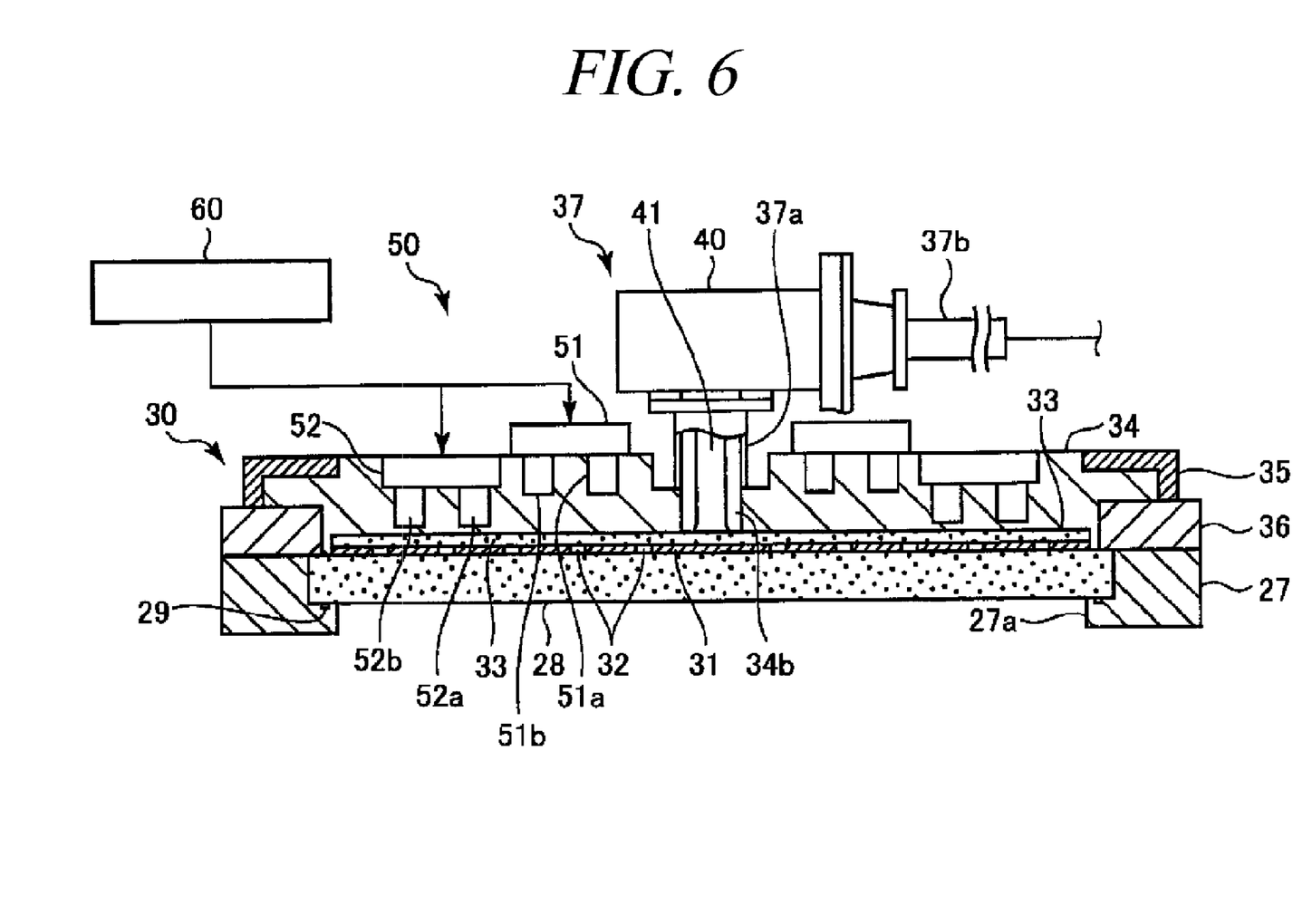
FIG. 6 is a schematic cross-sectional view of the magnet unit used in the plasma processing apparatus of FIG. 1, in which the inner ring-shaped magnet is moved.

Since the ring-shaped magnets 51 and 52 can be independently moved, plasma properties such as a plasma density can be controlled over a wide range. To be specific, when the inner ring-shaped magnet 51 is moved upwardly as illustrated in FIG. 6, a weak magnetic field is applied to an inner circumferential portion while a strong magnetic field is applied to a peripheral portion. As a result thereof, a plasma density is higher in the peripheral portion than in the inner circumferential portion of the chamber 1. In this way, by moving the ring-shaped magnets 51 and 52 independently, it is possible to control a plasma density distribution in a central portion and in the peripheral portion within the chamber 1.

Figure 7:
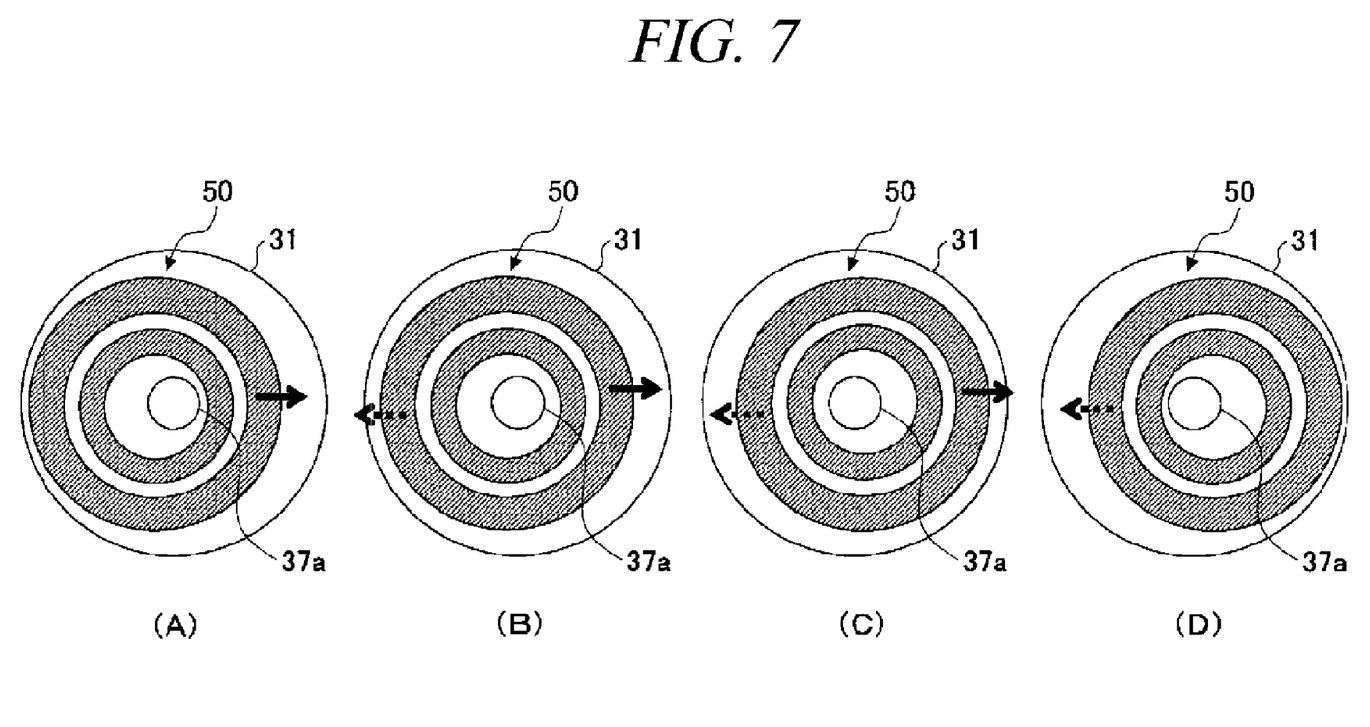
FIG. 7 is a schematic top view showing an example where the magnet unit used in the plasma processing apparatus of FIG. 1 is moved in a horizontal direction.

Further, the magnet unit 50 may be moved by a magnet moving unit 60 in a horizontal direction as well as a vertical direction. For example, the magnet unit 50 may be reciprocatively moved in one direction with respect to the coaxial waveguide 37a and the planar antenna 31 as illustrated in FIG. 7. That is, the magnet unit 50 may be moved from a position shifted to a left end as illustrated in FIG. 7(A) in a right direction as illustrated in FIGS. 7(B) and 7(C) to a position shifted to a right end (see, FIG. 7(D)) and moved again in sequence as shown in Figs. (C), (B) and (A) (in a direction of a dashed arrow). Further, after the reciprocating movement in such a direction for a predetermined time, the magnet unit 50 may be reciprocatively moved in a direction perpendicular thereto, for example.

Figure 8:
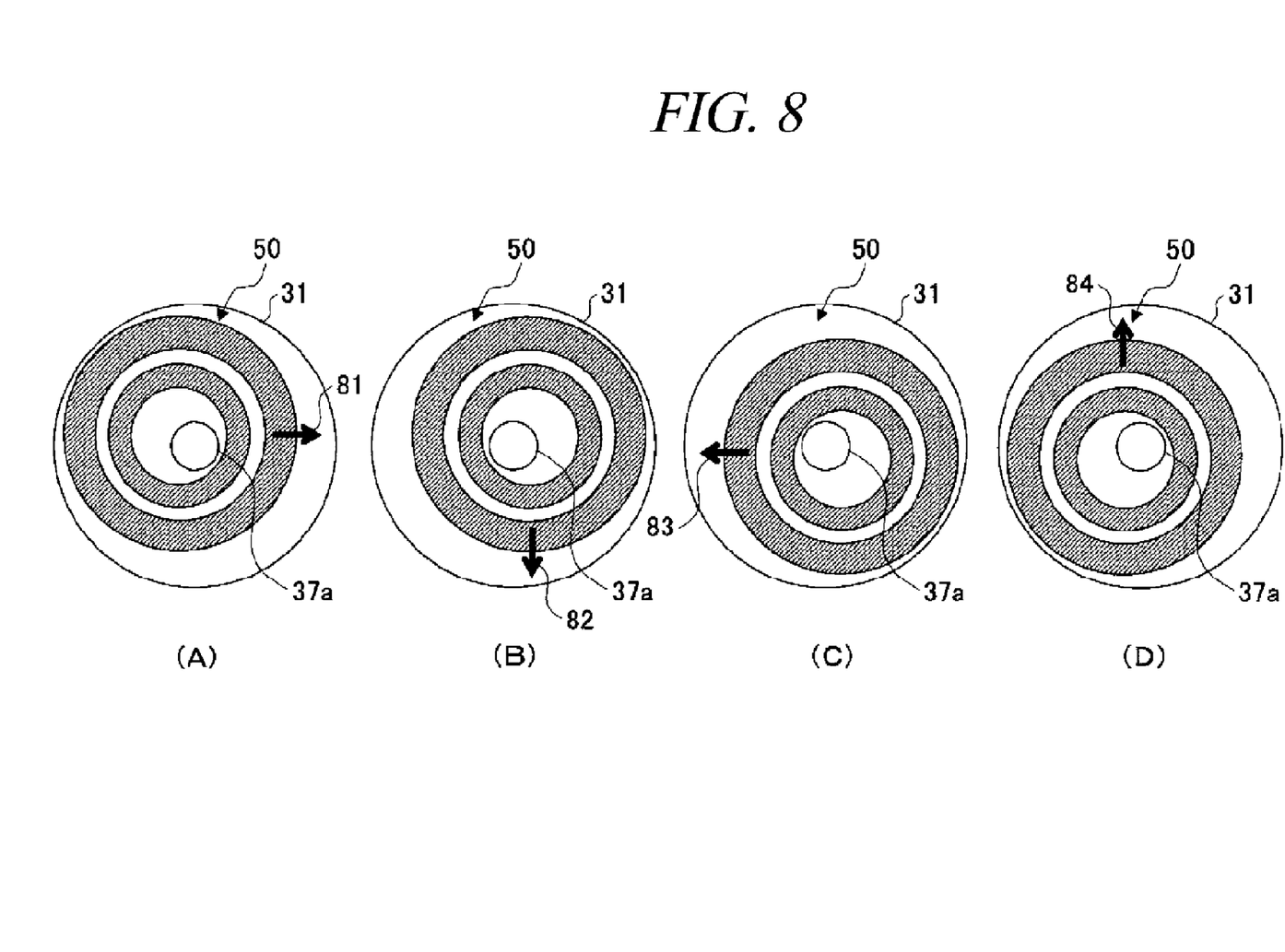
FIG. 8 is a schematic top view showing another example where the magnet unit used in the plasma processing apparatus of FIG. 1 is moved in a horizontal direction.

A movement type of the magnet unit 50 is not limited to such a reciprocating movement and the magnet unit 50 can be two-dimensionally moved in a horizontal direction. Referring to FIG. 8, the magnet unit 50 is moved from a position as shown in FIG. 8(A) to a position as shown in FIG. 8(B) in a direction of an arrow 81 and moved to a position as shown in FIG. 8(C) in a direction of an arrow 82 and then moved to a position as shown in FIG. 8(D) in a direction of an arrow 83. Thereafter, the magnet unit 50 is moved in a direction of an arrow 84 and returned to the position as shown in FIG. 8(A), and then the movements in the same sequence are repeated. In other words, the magnet unit 50 may be moved such that its center moves along a rectangular orbit.

Further, the magnet unit 50 may be moved such that its center revolves around the center of the coaxial waveguide 37a and the planar antenna 31. In other words, the magnet unit 50 may be revolved (eccentrically revolved) such that the center of the coaxial waveguide 37a and the planar antenna 31 is in agreement with a point deviated from the center of the magnet unit 50.

When the magnet unit 50 is moved in a horizontal direction as described above, plasma having a high density is moved together with the magnet unit 50 during a plasma process and the following effect can be obtained. For example, if the plasma processing apparatus 100 serves as a plasma etching apparatus, when the magnet unit 50 remains stopped, a same portion of the transmission plate 28 is exposed to the high density plasma and severely damaged as compared to other portions. Therefore, the transmission plate 28 has to be replaced frequently. However, when the magnet unit 50 is moved in a horizontal direction, it is possible to avoid exposing a specific portion to the high density plasma and thus the specific portion may not be severely damaged. Accordingly, the replacement frequency of the transmission plate 28 can be reduced.

Figure 9:
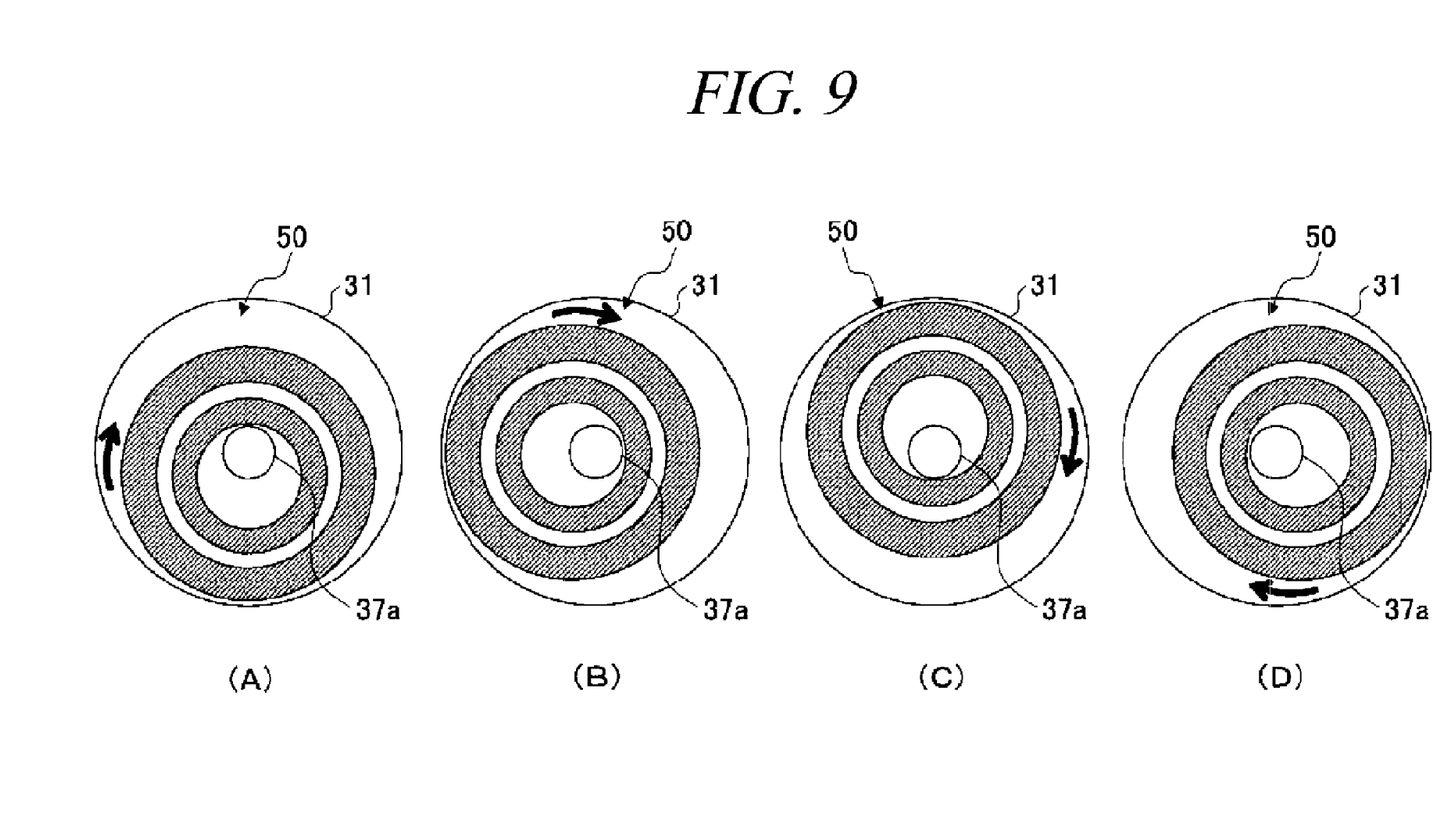
FIG. 9 is a schematic top view showing still another example where the magnet unit used in the plasma processing apparatus of FIG. 1 is moved in a horizontal direction.

When the magnet unit 50 is returned to the original position along any movement pattern illustrated in FIGS. 7 to 9, it is counted as one. In this case, it is desirable to set a movement period of the magnet unit 50 to be five or more times per minute and more desirably, to be about twenty times per minute. For example, in case of eccentric revolution, the number of revolutions is desirable to be about 20 rpm for the reason described below. Since it takes about one minute to process one wafer in the plasma processing apparatus 100, when the magnet unit 50 is eccentrically revolved at about 20 rpm, the magnet unit 50 revolves twenty times while one wafer is processed. A plasma density distribution with respect to the wafer becomes uniform in the wafer surface at such a number of revolutions, so that it is possible to perform a plasma process on the wafer with a substantially uniform density.

Further, the magnet moving unit 60 can be comprised of components well known in the field of a semiconductor device manufacturing apparatus. For example, the magnet moving unit 60 may include a pneumatic cylinder so as to move the magnet unit 50 (ring-shaped magnets 51 and 52) in a vertical direction; a linear motor so as to reciprocatively move the magnet unit 50 (ring-shaped magnets 51 and 52); or a rotating motor and a toothed wheel combined therewith so as to eccentrically revolve the magnet unit 50 (ring-shaped magnets 51 and 52).

Furthermore, the magnet moving unit 60 may be configured to move the magnet unit 50 in a vertical direction as well as in a horizontal direction as described above. However, the plasma processing apparatus 100 may include one moving unit configured to move the magnet unit 50 in a vertical direction and the other moving unit configured to move the magnet unit 50 in a horizontal direction instead of the magnet moving unit 60. Moreover, a movement direction of the magnet unit 50 is not limited to any one of the vertical direction and the horizontal direction. That is, the magnet unit 50 may be moved at a certain angle to the planar antenna 31 in order to achieve any required plasma property.

Alternatively, the magnet unit 50 may include one ring-shaped magnet or three or more ring-shaped magnets.

The plasma processing apparatus 100 includes a controller 70 made up of a microprocessor (computer). The controller 70 is connected with various components such as the microwave generator 39, the gas supply unit 16, the evacuation unit 24, the temperature controller 21 and the magnet moving unit 60 and controls these components. In particular, the magnet moving unit 60 moves the magnet unit 50 under the control of the controller 70 and a required plasma density in the chamber 1 can be obtained. The controller 70 is further connected with a user interface 71 including a keyboard by which an operator inputs a command or the like to manage the plasma processing apparatus 100 or a display showing an operation status of the plasma processing apparatus 100.

Furthermore, the controller 70 is connected with a storage 72. The storage 72 stores a program used for performing various processes by the controller 70 in the plasma processing apparatus 100. The program includes a control program used for controlling various processes by the controller in the plasma processing apparatus 100 or a program (i.e., recipe) used for operating each component of the plasma processing apparatus 100 according to a process condition. Further, these programs are stored in a computer-readable storage medium 73 from which the programs are downloaded to the storage 72. The computer-readable storage medium 73 may be a hard disc (including a portable hard disc), a semiconductor memory such as a flash memory, an optical disc such as a CD-ROM or a DVD, a magnetic disc such as a floppy disc, or a USB memory. The recipe or the like may be stored in the storage 72 through a line from another device such as a server.

The storage 72 stores various recipes downloaded from the computer-readable storage medium 73, and if necessary, a recipe specified by the command from the user interface 71 is read from the storage 72 by the controller 70. The read recipe is executed by the controller 70 and a required process in the plasma processing apparatus 100 is performed under the control of the controller 70.

Hereinafter, operations of the plasma processing apparatus 100 configured as described above will be explained.

A wafer W is loaded into the chamber 1 and mounted on the susceptor 5. Then, according to the process conducted in the plasma processing apparatus 100, a processing gas including a rare gas such as Ar, Kr or He, an oxidizing gas such as $O_2$, $N_2O$, NO, $NO_2$ or $CO_2$, a nitriding gas such as $N_2$ or $NH_3$, a source gas used for a thin film deposition, an etching gas or a combination thereof is introduced into the chamber 1 from the gas supply unit 16 through the gas inlet opening 15a at a predetermined flow rate.

Subsequently, the microwave generator 39 is operated to generate a microwave, and the microwave is induced to the waveguide 37 via the matching circuit 38 and is passed through the rectangular waveguide 37b, the mode converter 40 and the coaxial waveguide 37a in sequence.

The microwave is propagated in a TE mode within the rectangular waveguide 37b and the TE mode microwave is converted into a TEM mode by the mode converter 40 and then the TEM mode microwave is propagated within the coaxial waveguide 37a. Thereafter, the TEM mode microwave reaches the planar antenna 31 and is radiated into the chamber 1 from the plurality of slot holes 32 of the planar antenna 31 through the transmission plate 28. An electromagnetic field is generated by the radiated microwave within the chamber 1 and a processing gas is excited into plasma.

The excited plasma formed by the microwave radiated from the plurality of slot holes 32 of the planar antenna 31 is surface wave plasma excited by a surface wave propagated along an interface between the dielectric member and the plasma and has an electron temperature as low as about 1.5 eV or less in a vicinity of the wafer W at a high density ranging from about $1 \times 10^{11}$ to about $5 \times 10^{12}/cm^3$. Accordingly, the wafer W is processed with active species generated by the plasma while plasma damage to the wafer is reduced.

If the magnetic field generated by the magnet unit 50 is applied to the inside of the chamber 1 where the microwave plasma is generated as described above, an E×B drift is generated in the plasma, thereby increasing the plasma density. To be specific, strong magnetic fields are formed between the ring-shaped magnets 51 and 52 of the magnet unit 50, between an N-pole and an S-pole of the ring-shaped magnet 51 and between an N-pole and an S-pole of the ring-shaped magnet 52, respectively (see FIG. 5) and thus three plasma rings having a concentric circular shape can be generated corresponding to the magnetic fields. In this way, the plasma can be concentrated on a region having a strong magnetic field. Accordingly, by applying a strong magnetic field to, e.g., a peripheral portion having a low plasma density, uniformity of plasma properties such as a plasma density can be increased. Further, by forming a plurality of plasma rings, the plasma density can be uniformized over a wide range.

The microwave plasma generated in the plasma processing apparatus 100 is surface wave plasma, so that plasma is generated only in a vicinity of the transmission plate 28. Therefore, even if the magnet unit 50 (ring-shaped magnets 51 and 52) is positioned at an upper part of the microwave introduction unit 30, it is relatively closer to the plasma and thus influence of the magnetic field on the plasma can be increased. Therefore, a plasma density distribution can be efficiently controlled. Further, since the magnet unit 50 can be positioned relatively closer to the plasma, the magnet unit 50 can be miniaturized and thus the influence of the magnetic field onto the semiconductor wafer W can be reduced. To be specific, a magnetic flux density on the semiconductor wafer W can be set to be about 30 Gauss or less. Accordingly, it is possible to suppress charge-up damage or damage to the semiconductor wafer W caused by the magnetic field. Furthermore, since the magnet unit 50 can be miniaturized as described above, it can be readily used when a diameter of the chamber 1 is increased. Moreover, in case of using a transmission plate 28 having a dome shape as illustrated in FIG. 10, a thickness of the transmission plate 28 can be reduced. In this case, it is possible to bring the magnet unit 50 much closer to the plasma.

In the present embodiment, the ring-shaped magnets 51 and 52 are independently brought close to or away from the chamber 1 by the magnet moving unit 60, so that a magnetic field intensity within the chamber 1, a plasma density or the like can be controlled, whereby uniformity of a process property can be improved.

The present invention has been explained in the above-described embodiments, but it is not limited to these embodiments. It would be conceived various modifications and embodiments without departing from the claimed present invention.

The plasma process is not specifically limited and may include various processes such as an oxidation process, a nitridation process, an oxynitridation process, a thin film deposition process and an etching process.

In the magnet unit 50, two ring-shaped magnets are arranged in a concentric circle shape. However, as described above, one ring-shaped magnet or three or more ring-shaped magnets may be arranged in the magnet unit 50. If the magnet unit 50 has one ring-shaped magnet, the one ring-shaped magnet is moved by the magnet moving unit in a vertical direction or in a horizontal direction. Further, if the magnet unit 50 has three or more ring-shaped magnets, at least one ring-shaped magnet may be moved by the magnet moving unit. A shape of the magnet in the magnet unit is not limited to a ring shape.

Further, the target object is not limited to the semiconductor wafer and can be other substrates such as a FPD glass substrate. In case of a rectangular substrate such as the FPD glass substrate, the magnet of a rectangular shape corresponding to the glass substrate may be used instead of the ring-shaped magnet and one or more rectangular magnets may be arranged concentrically.

Furthermore, the plurality of N-polar segments 51a and the plurality of S-polar segments 51b are attached to the ring-shaped magnet 51. Alternatively, instead of the N-polar segments and the S-polar segments, a plurality of electromagnetic coils may be attached thereto. Magnetic fields illustrated in FIG. 5 may be generated by applying an electric current to the electromagnetic coils.

It has been explained that the magnet unit 50 is eccentrically revolved, with reference to FIG. 9, but the following case can be also employed. For example, a ring-shaped plate is provided, N-polar segments 51a and 52a and S-polar segments 51b and 52b are attached to one surface of the ring-shaped plate in a non-concentric circular shape with respect to the ring-shaped plate, and the ring-shaped plate may be rotated around the center of the coaxial waveguide 37a and the planar antenna 31, whereby it can be rotated in substantially the same manner as the eccentric revolution illustrated in FIG. 9.

The present application claims the benefit of Japanese Patent Application Ser. No. 2007-058537, filed on Mar. 8, 2007, of which specification, claims and drawings are hereby incorporated by reference in its entirety.

What is claimed is:
1. A plasma processing apparatus comprising:
a processing vessel accommodating a target object;
a microwave generator configured to generate a microwave;
a waveguide configured to induce the microwave generated by the microwave generator to the processing vessel;
a planar antenna made of a conductive material and having a plurality of microwave radiation holes through which the microwave induced to the waveguide is radiated toward the processing vessel;
a microwave transmission plate made of a dielectric material and configured to serve as a ceiling wall of the processing vessel and transmit the microwave passed from the microwave radiation holes of the planar antenna;
a processing gas inlet unit configured to introduce a processing gas into the processing vessel;
a magnetic field generating unit positioned above the planar antenna and configured to generate a magnetic field within the processing vessel and control a property of plasma of the processing gas by the magnetic field, the plasma being generated by the microwave within the processing vessel; and
a first moving unit configured to move the magnetic field generating unit in a first direction that is transverse to a second direction oriented toward or away from the processing vessel.

2. The plasma processing apparatus of claim 1, wherein the magnetic field generating unit includes a ring-shaped magnet arranged concentrically with the planar antenna.

3. The plasma processing apparatus of claim 1, further comprising:
a second moving unit configured to move the magnetic field generating unit in the second direction.

4. The plasma processing apparatus of claim 1, wherein the first moving unit moves the magnetic field generating unit such that a center of the magnetic field generating unit revolves around a center of the planar antenna.

5. The plasma processing apparatus of claim 1, wherein the magnetic field generating unit includes at least two ring-shaped magnets arranged concentrically with the planar antenna.

6. The plasma processing apparatus of claim 5, further comprising:
a third moving unit configured to move at least one of the ring-shaped magnets in the second direction.

7. The plasma processing apparatus of claim 5, further comprising:
a fourth moving unit configured to move at least one of the ring-shaped magnets in the first direction.

8. The plasma processing apparatus of claim 7, wherein the fourth moving unit moves at least one of the ring-shaped magnets such that a center of at least one of the ring-shaped magnets revolves around a center of the planar antenna.

9. The plasma processing apparatus of claim 6, further comprising:
a controller configured to control movement of the ring-shaped magnets such that the property of plasma within the processing vessel is controlled by the ring-shaped magnetic field generating unit.

10. A plasma processing apparatus comprising:
a processing vessel accommodating a target object;
a microwave generator configured to generate a microwave;
a waveguide configured to induce the microwave generated by the microwave generator to the processing vessel;
a planar antenna made of a conductive material and having a plurality of microwave radiation holes through which the microwave induced to the waveguide is radiated toward the processing vessel;
a microwave transmission plate made of a dielectric material and configured to serve as a ceiling wall of the processing vessel and transmit the microwave passed from the microwave radiation holes of the planar antenna;

a processing gas inlet unit configured to introduce a processing gas into the processing vessel;

a magnetic field generating unit positioned above the planar antenna and configured to generate a magnetic field within the processing vessel and control a property of plasma of the processing gas by the magnetic field, the plasma being generated by the microwave within the processing vessel, the magnetic field generating unit comprising at least two ring-shaped magnets arranged concentrically with the planar antenna; and a magnet moving unit configured to move at least one of the ring-shaped magnets.

11. The plasma processing apparatus of claim 10, wherein the magnet moving unit comprises a first moving unit configured to move at least one of the ring-shaped magnets in a second direction oriented toward or away from the processing vessel.

12. The plasma processing apparatus of claim 10, wherein the magnet moving unit comprises a second moving unit configured to move at least one of the ring-shaped magnets in a first direction that is transverse to a second direction oriented toward or away from the processing vessel.

13. The plasma processing apparatus of claim 12, wherein the second moving unit moves at least one of the ring-shaped magnets such that a center of at least one of the ring-shaped magnets revolves around a center of the planar antenna.

14. The plasma processing apparatus of claim 11, further comprising:

a controller configured to control movement of the ring-shaped magnets such that the property of plasma within the processing vessel is controlled by the magnetic field generating unit.

* * * * *